(12) United States Patent
Chen et al.

(10) Patent No.: US 7,492,956 B2
(45) Date of Patent: Feb. 17, 2009

(54) VIDEO CODING USING MULTI-DIMENSIONAL AMPLITUDE CODING AND 2-D NON-ZERO/ZERO CLUSTER POSITION CODING

(75) Inventors: Wen-hsiung Chen, Sunnyvale, CA (US); Fang Wu, Pleasanton, CA (US); John A. Toebes, Cary, NC (US)

(73) Assignee: Cisco Technology, Inc., San Jose, CA (US)

( * ) Notice: Subject to any disclaimer, the term of this patent is extended or adjusted under 35 U.S.C. 154(b) by 883 days.

(21) Appl. No.: 10/922,507

(22) Filed: Aug. 18, 2004

(65) Prior Publication Data

US 2006/0039620 A1   Feb. 23, 2006

(51) Int. Cl.
*G06K 9/36* (2006.01)
(52) U.S. Cl. ..................................................... 382/245
(58) Field of Classification Search .................. 382/245
See application file for complete search history.

(56) References Cited

U.S. PATENT DOCUMENTS

| | | | |
|---|---|---|---|
| 4,698,672 A | 10/1987 | Chen et al. ................... 358/136 |
| 4,706,265 A | 11/1987 | Furukawa ..................... 375/122 |
| 4,813,056 A | 3/1989 | Fedele .......................... 375/27 |
| 4,821,119 A | 4/1989 | Gharavi ................. 375/240.16 |
| 4,845,560 A | 7/1989 | Kondo et al. ................. 358/133 |
| 4,858,017 A | 8/1989 | Torbey ........................ 358/426 |
| 4,920,426 A | 4/1990 | Hatori et al. ................. 358/433 |
| 4,922,510 A | 5/1990 | Brusewitz .................... 375/122 |
| 4,937,573 A | 6/1990 | Silvio et al. .................... 341/67 |
| 4,985,700 A | 1/1991 | Mikami ........................ 341/59 |
| 4,985,766 A | 1/1991 | Morrison et al. ............. 358/133 |
| 5,006,930 A | 4/1991 | Stroppiana et al. ........... 358/133 |
| 5,045,938 A | 9/1991 | Sugiyama .................... 358/133 |
| 5,062,152 A | 10/1991 | Faulkner ..................... 359/185 |

(Continued)

FOREIGN PATENT DOCUMENTS

EP   0 266 049 A2   5/1988

(Continued)

OTHER PUBLICATIONS

G. Cote, B. Erol, M. Gallant, & F. Kossentini, "H.263+: Video Coding at Low Bit Rates" in *IEEE Transactions on Circuits and Systems for Video Technology*, vol. 8, No. 7, Nov. 1998.

(Continued)

*Primary Examiner*—Wenpeng Chen
(74) *Attorney, Agent, or Firm*—Dov Rosenfeld; INVENTEK

(57) ABSTRACT

A method, apparatus, and computer readable medium to encode a series of quantized transform coefficients. The method includes identifying events that each includes a run of one or more non-zero-valued coefficients, and for each such event, encoding the event with a codeword that for at least some events, relatively more likely-to-occur events are encoded by a shorter codeword than relatively less likely-to-occur events, and for each identified event, jointly encoding according to an amplitude coding method, a plurality of consecutive values in the run of consecutive non-zero-valued coefficients. The method is applicable to encoding a region in the series where there is likely to be a cluster of non-zero-valued coefficient.

64 Claims, 6 Drawing Sheets

U.S. PATENT DOCUMENTS

| | | | | |
|---|---|---|---|---|
| 5,086,488 A | 2/1992 | Kato et al. | | 382/56 |
| 5,109,451 A * | 4/1992 | Aono et al. | | 382/166 |
| 5,128,758 A | 7/1992 | Azadegan et al. | | 358/133 |
| 5,136,376 A | 8/1992 | Yagasaki et al. | | 358/133 |
| 5,162,795 A | 11/1992 | Shirota | | 341/67 |
| 5,166,684 A | 11/1992 | Juri et al. | | 341/67 |
| 5,179,442 A | 1/1993 | Azadegan et al. | | 358/133 |
| 5,226,082 A | 7/1993 | Kustka | | 380/46 |
| 5,253,053 A | 10/1993 | Chu et al. | | 358/133 |
| 5,253,055 A | 10/1993 | Civanlar et al. | | 358/133 |
| 5,291,282 A | 3/1994 | Nakagawa et al. | | 348/384 |
| 5,298,991 A | 3/1994 | Yagasaki et al. | | 348/416 |
| 5,301,032 A | 4/1994 | Hong et al. | | 358/261.2 |
| 5,307,163 A | 4/1994 | Hatano et al. | | 348/415 |
| 5,319,457 A | 6/1994 | Nakahashi et al. | | 348/387 |
| 5,337,087 A | 8/1994 | Mishima | | 348/405 |
| 5,363,097 A | 11/1994 | Jan | | 341/67 |
| 5,371,811 A | 12/1994 | Morrison et al. | | 382/56 |
| 5,400,075 A | 3/1995 | Savatier | | 348/384 |
| 5,402,244 A | 3/1995 | Kim | | 358/261.4 |
| 5,446,744 A | 8/1995 | Nagasawa et al. | | 371/37.4 |
| RE35,093 E | 11/1995 | Wang et al. | | 348/413 |
| 5,475,501 A | 12/1995 | Yagasaki | | 358/426 |
| 5,479,527 A | 12/1995 | Chen | | 382/232 |
| 5,488,367 A | 1/1996 | Kitamura | | 341/106 |
| 5,488,418 A | 1/1996 | Mishima et al. | | 348/398 |
| 5,488,616 A | 1/1996 | Takishima et al. | | 371/30 |
| 5,491,480 A | 2/1996 | Jan et al. | | 341/67 |
| 5,528,628 A | 6/1996 | Park et al. | | 375/240 |
| 5,539,401 A | 7/1996 | Kumaki et al. | | 341/67 |
| 5,640,420 A | 6/1997 | Jung | | 375/240 |
| 5,642,115 A | 6/1997 | Chen | | 341/67 |
| 5,644,305 A | 7/1997 | Inoue et al. | | 341/67 |
| 5,648,774 A | 7/1997 | Hsieh | | 341/67 |
| 5,650,782 A | 7/1997 | Kim | | 341/67 |
| 5,696,558 A | 12/1997 | Tsukamoto | | 348/405 |
| 5,717,394 A | 2/1998 | Schwartz et al. | | 341/51 |
| 5,731,836 A | 3/1998 | Lee | | 348/402 |
| 5,740,283 A | 4/1998 | Meeker | | 382/248 |
| 5,751,232 A | 5/1998 | Inoue et al. | | 341/63 |
| 5,767,800 A | 6/1998 | Machida et al. | | 341/67 |
| 5,767,908 A | 6/1998 | Choi | | 348/403 |
| 5,774,594 A | 6/1998 | Kitamura | | 382/239 |
| 5,793,432 A | 8/1998 | Mishima et al. | | 348/423 |
| 5,793,897 A | 8/1998 | Jo et al. | | 382/246 |
| 5,818,877 A | 10/1998 | Tsai et al. | | 375/241 |
| 5,822,463 A | 10/1998 | Yokose et al. | | 382/251 |
| 5,832,130 A | 11/1998 | Kim | | 382/234 |
| 5,844,611 A | 12/1998 | Hamano et al. | | 348/403 |
| 5,852,469 A | 12/1998 | Nagai et al. | | 348/384 |
| 5,883,589 A | 3/1999 | Takishima et al. | | 341/67 |
| 5,923,813 A | 7/1999 | Okamoto et al. | | 386/109 |
| 5,956,153 A | 9/1999 | Hirabayashi | | 358/433 |
| 5,982,437 A | 11/1999 | Okazaki et al. | | 348/413 |
| 5,999,111 A | 12/1999 | Park et al. | | 341/67 |
| 6,014,095 A | 1/2000 | Yokoyama | | 341/67 |
| 6,104,754 A | 8/2000 | Chujoh et al. | | 375/240 |
| 6,111,914 A | 8/2000 | Bist | | 375/240 |
| 6,118,822 A | 9/2000 | Bist | | 375/240 |
| 6,140,944 A | 10/2000 | Toyoyama | | 341/63 |
| 6,144,322 A | 11/2000 | Sato | | 341/67 |
| 6,198,848 B1 | 3/2001 | Honma et al. | | 382/232 |
| 6,218,968 B1 | 4/2001 | Smeets et al. | | 341/65 |
| 6,229,460 B1 | 5/2001 | Tsai et al. | | 341/67 |
| 6,256,064 B1 | 7/2001 | Chujoh et al. | | 348/240.23 |
| 6,278,801 B1 | 8/2001 | Boon | | 382/246 |
| 6,304,607 B1 | 10/2001 | Talluri et al. | | 375/240.27 |
| 6,339,386 B1 | 1/2002 | Cho | | 341/67 |
| 6,388,588 B2 | 5/2002 | Kitamura | | 341/67 |
| 6,404,929 B1 | 6/2002 | Boon | | 382/233 |
| 6,408,029 B1 | 6/2002 | McVeigh et al. | | 375/240.13 |
| 6,445,314 B1 | 9/2002 | Zhang et al. | | 341/67 |
| 6,445,739 B1 | 9/2002 | Shen et al. | | 375/240.03 |
| 6,477,280 B1 | 11/2002 | Malvar | | 382/245 |
| 6,771,828 B1 | 8/2004 | Malvar | | 382/240 |
| 2004/0228540 A1 | 11/2004 | Chen et al. | | 382/246 |
| 2005/0226513 A1* | 10/2005 | Wallace et al. | | 382/232 |

FOREIGN PATENT DOCUMENTS

| | | |
|---|---|---|
| WO | WO 93/18616 | 9/1993 |
| WO | WO 03/090421 | 10/2003 |

OTHER PUBLICATIONS

T. Chujoh & Y. Kikuchi, "An improved variable length coding", *Joint Video Team (JVT) of ISO/IEC MPEG & ITU-T VCEG*, 2nd Meeting: Geneva, CH, Jan. 29-Feb. 1, 2002.

M. Luttrell, J. Wen, H. Yao, and J. Villasen: "Robust Low Bit Rate Wireless Video Communications," Final Report, Project 97-193, University of California Micro project, available on http://www.ucop.edu/research/micro/97_98/97_193.pdf.

P.N. Tudor, "MPEG-2 Video Compression", IEE J Langham Thompson Prize, *Electronics & Communication Engineering Journal*, Dec. 1995. Available on http://www.bbc.co.uk/rd/pubs/papers/paper_14/paper_14.html.

"H.264/MPEG-4 AVC Video Compression Tutorial", *VideoLocus*, 2002, available on http://www.videolocus.com.

"MPEG-1 Video Codec", pp. 1-8, available on http://www.cmlab.csie.ntu.edu.tw/cml/dsp/training/coding/mpeg1/.

K. Takagi, "Reversibility of Code", *Joint Video Team (JVT) of ISO/IEC MPEG & ITU-T VCEG*, 2nd Meeting: Geneva, CH, Jan. 29-Feb. 1, 2002.

A. Bist, "An Adaptive Quantization Scheme for H.263++", ITU-Telecommunication Standardization Sector q15a49, Working Party 15/1, Expert's Group on Very Low Bitrate Visual Telephony, Portland, Jun. 24-27, 1997.

Reed, E.C. and Lim, J.S. "Efficient Coding of DCT Coefficients by Joint Position-Dependent Encoding." *Proceedings of the 1998 IEEE International Conference on Acoustics, Speech and Signal Processing*, May 12, 1998, pp. 2817-2820, IEEE, New York, NY.

Cheung, K.M. and Kiely, A. "An Efficient Variable Length Coding Scheme for an IID Source." *Proceedings of the Data Compression Conference*, Mar. 28, 1995, pp. 182-191, IEEE Computer Society Press, Los Alamitos, CA.

Simon, S. and De Vriendt, J. "Progressive Image Transmission with Run-Length Coding." *Journal on Communications*, vol. 45, May 1994, pp. 45-50, Budapest, Hungary.

Jeon, B., Park, J. and Jeong, J. "Huffman Coding of DCT Coefficients Using Dynamic Codeword Assignment and Adaptive Codebook Selection." *Signal Processing Image Communication*, vol. 12, No. 3, Jun. 1, 1998, pp. 253-262, Elsevier Science Publishers, Amsterdam, NL.

Chandra, A. and Chakrabarty, K. "Reduction of SOC Test Data Volume, Scan Power and Testing Time Using Alternating Run-length Codes." *Proceedings of the 39th Design Automation Conference*, Jun. 10, 2002, pp. 673-678, ACM, New York, NY.

Taubman, D.S. "Section 2.4.3: Run-Length Coding." *JPEG2000: Image Compression Fundamentals, Standards, and Practice*, 2002, Kluwer Academic Publishers, Dordrecht, NL.

Golomb, S. "Run-Length Encodings." *IEEE Transactions on Information Theory*, vol. 12, No. 3, Jul. 1966, pp. 399-401.

Gallager, R.G. and Van Voorhis, D.C. "Optimal Source Codes for Geometrically Distributed Integer Alphabets." *IEEE Transactions on Information Theory*, vol. IT-21, No. 2, Mar. 1975, pp. 228-230.

\* cited by examiner

VIDEO CODING USING MULTI-DIMENSIONAL AMPLITUDE CODING AND 2-D NON-ZERO/ZERO CLUSTER POSITION CODING

RELATED PATENT APPLICATIONS

This invention is related to concurrently filed U.S. patent application Ser. No. 10/922,508 to inventors Toebes, et al. titled TWO-DIMENSIONAL VARIABLE LENGTH CODING OF RUNS OF ZERO AND NON-ZERO TRANSFORM COEFFICIENTS FOR IMAGE COMPRESSION. U.S. patent application Ser. No. 10/922,508 is incorporated herein by reference, except any material incorporated by reference in U.S. patent application Ser. No. 10/922,508 and not explicitly incorporated by reference in the present disclosure, and referred to as the "2-D Non-Zero/Zero Cluster Coding Method" herein.

BACKGROUND

The present invention relates to image coding, and in particular to variable length coding of an ordered series of quantized transform coefficients of a transform of a block of image data.

Two-dimensional variable length coding, referred to as 2D-VLC, has been widely used to code quantized transform coefficients. In traditional 2D-VLC, statistics are collected or assumed of events that include a run of consecutive zero-valued coefficients followed by a single non-zero amplitude coefficient that follows the run length. The ordering of the series of quantized transform coefficients is along a pre-selected path, e.g., a zig-zag path, in the two-dimensional path of the transform. Thus, in a typical implementation, a two-dimensional table consisting of the ending amplitude and the run-length of the preceding consecutive zero-valued coefficients is constructed and variable length codes, such as optimal Huffman codes or arithmetic codes, are assigned according to the assumed or measured statistics to form the 2D-VLC table for the subsequent encoding process. Shorter code lengths are used for the more likely-to-occur, e.g., more frequently occurring events.

2D-VLC is used in common transform coding methods, such as JPEG, MPEG1, MPEG2, ITU-T-261, etc., as follows. For motion video, an image is divided into blocks, e.g., 8 by 8 or 16 by 16 blocks. Each image is classified as interframe or intraframe. Interframe images are typically post motion compensation. The blocks of the image are transformed and the transform coefficients are quantized. The quantized transform coefficients are then coded along a specified path according to a 2D-VLC table. Interframe and intraframe images typically have different 2D-VLC tables. The DC component is typically separately encoded. Furthermore, the 2D-VLC table may be truncated so that the least frequently occurring events use an escape code followed by a fixed length code. A special "EOB" code is used to indicate the end of the block when all remaining coefficients are zero.

One advantage of traditional 2D-VLC is that the position of each non-zero-valued quantized coefficient and its amplitude are coded simultaneously, which generally result in shorter code lengths than using a separate code, e.g., a VLC code for each non-zero-valued coefficient and coefficient amplitude.

Because of the widespread use of image coding, many patents have been issued on different forms of VLC. U.S. Pat. No. 4,698,672 issued Oct. 6, 1987 to Wen-hsiung Chen, one of the inventors of the present invention, for example, described one form of a two-dimensional variable length coding method.

One deficiency of 2D-VLC is that every non-zero-valued coefficient needs to be accompanied by a runlength code to identify its position, in the form of the number of preceding zero-valued coefficients.

In block based transform coding, there often is a region, e.g., a low-frequency region along the ordering in which non-zero-valued coefficients tend to cluster, i.e., there are often a number of consecutive non-zero-valued coefficients along the low frequency region of the pre-determined path. Each one of a number of such consecutive non-zero-valued coefficients would require the same number of codewords representing the position and amplitude.

U.S. patent application Ser. No. 10/342,537 to inventors Chen et al., filed Jan. 15, 2003 and titled AN EXTENSION OF TWO-DIMENSIONAL VARIABLE LENGTH CODING FOR IMAGE COMPRESSION describes a method called the "Extended 2D-VLC Method" herein that includes encoding repetitions of some non-zero coefficient values. One variant of the Extended 2D-VLC method provides codes for all the possible amplitude variations of consecutive coefficients that follow a set of zero-valued coefficients. This effectively reduced the runlength to 1 for all cases. The difficulty of this approach is that there are enormous numbers of patterns that can be generated from the amplitudes of consecutive coefficients. For example, with 32 quantization levels as defined in many common video coding standards, there are in the order of $32^n$ patterns that can be generated from n consecutive coefficients. As such, in a practical implementation, only a limited number of the most likely-to-occur non-zero amplitude values, such as 1 and 2, and a limited number of lengths of consecutive non-zero-values, such as 3 or 4 consecutive values, are regrouped for pattern matching.

Furthermore, in coding, while there may be a region where there are clusters of non-zero-valued coefficients, there is also likely to be a high frequency region where any non-zero-valued coefficients are likely to be scattered.

With these observations in mind, U.S. patent application Ser. No. 10/869,229 to inventors Chen et al., filed Jun. 15, 2004 and titled A HYBRID VARIABLE LENGTH CODING METHOD FOR LOW BIT RATE VIDEO CODING, was developed to encode the position and amplitude of quantized transform coefficients separately and takes advantage of the nature of the distribution of the transform coefficients in the low frequency and high frequency regions. U.S. patent application Ser. No. 10/869,229 is incorporated herein by reference, except any material incorporated by reference in U.S. patent application Ser. No. 10/869,229 and not explicitly incorporated by reference in the present disclosure. The methods described in U.S. patent application Ser. No. 10/869,229 are each and collectively called the "Basic Hybrid VLC Method" herein.

U.S. patent application Ser. No. 10/898,654 to inventors Chen et al., filed Jul. 22, 2004 and titled AN EXTENDED HYBRID VARIABLE LENGTH CODING METHOD FOR LOW BIT RATE VIDEO CODING, was invented, and provides an alternative coding method for the high frequency region by taking advantage of the very few amplitude values in the high frequency region, especially, for example, for low bit rate and interframe applications. U.S. patent application Ser. No. 10/898,654 is incorporated herein by reference, except any material incorporated by reference in U.S. patent application Ser. No. 10/898,654 and not explicitly incorporated by reference in the present disclosure. The methods described in U.S. patent application Ser. No. 10/898,654 are each and collectively called the "Extended Hybrid VLC Method" herein.

In one embodiment of the above-mentioned Basic Hybrid VLC Method, two independent types of coding schemes are introduced to code the quantized coefficients along the path. A boundary is established along the path to define two regions, e.g., a low frequency region and a high frequency region. The boundary can be made adaptive to the video depending on a number of factors such as intraframe coding or interframe coding, standard definition television (SDTV) or high definition television (HDTV), complex scene or simple scene, high bit rate coding or low bit rate coding, and so forth. In one embodiment, the encoding of the quantized coefficients in the low-frequency region includes coding the positions of consecutive non-zero-valued coefficients and the positions of consecutive zero-valued coefficients using a run-length coding method of a first type and a run-length coding method of a second type. The encoding further includes coding the amplitude values and sign of the non-zero-valued coefficients. In the high-frequency region, in one embodiment, the encoding of coefficients in the high frequency region includes encoding the positions of runs of none or more consecutive zero-valued coefficients using a run-length coding method of a third type. The encoding further includes coding the amplitude values and sign of the non-zero-valued coefficients.

In one embodiment of the above-mentioned Extended Hybrid VLC Method, a coding method is used in the second region that takes into account that almost all non-zero-valued coefficients in the high frequency region are ±1. No amplitude coding is needed to encode runs of consecutive zeroes that end in a coefficient of amplitude 1. An exception (escape) code is included to encode those rare non-zero-valued coefficients that have values other than ±1.

In the Basic Hybrid VLC Method and the Extended Hybrid VLC Method, the consecutive non-zero-valued coefficients and the consecutive zero-valued coefficients in the low frequency region are coded alternatively using two independent one-dimensional variable length coding methods, e.g., using two independent one-dimensional VLC tables. An observation was made that an improvement in coding efficiency can further be achieved by pairing the consecutive non-zero-valued coefficients and zero-valued coefficients as a pair and applying a single two-dimensional table to code the pair. With is observation, the 2-D Non-Zero/Zero Cluster Coding Method was introduced to improve the coding efficiency, for example of the low frequency region, and in other embodiments of more than the low frequency region.

In one embodiment of the 2-D Non-Zero/Zero Cluster Coding Method, a method includes, in a first region, identifying events that each includes a run of zero-valued coefficients preceding a run of one or more non-zero-valued coefficients. The method includes for each such event, jointly encoding the run lengths of the preceding run of zero-valued coefficients and the following run of non-zero-valued coefficients with a codeword, such that for at least some events, relatively more likely-to-occur pairs of runlengths are encoded by a shorter codeword than relatively less likely-to-occur runlengths. The method further includes encoding each amplitude in the run of consecutive non-zero-valued coefficients, and encoding the signs of such coefficients. In an improved variation, each event includes a single zero-valued coefficient following the run of non-zero-valued coefficients.

In each of the 2-D Non-Zero/Zero Cluster Coding Method, the Basic Hybrid VLC Method, and the Extended Hybrid VLC Method, various variable length coding methods are introduced to encode the relative positions of the clustered or non-clustered transform coefficients. After each such encoding, a coding of the magnitude of each non-zero valued coefficient is included, as is a sign bit (+ or −).

The inventors have noticed that encoding the amplitudes takes up a significant part of the code in VLC coding of clusters of non-zero-valued coefficients.

Thus there remains a need to improve the coding efficiency of the coefficient amplitudes of clusters of non-zero-valued coefficients.

SUMMARY

Described herein are a Method, apparatus, and carrier medium to encode a series of signals having the most likely-to-occur value and at least one other value. One application is encoding a series of quantized transform coefficients of a block of image data. One method embodiment includes, in a first region, identifying events that each includes a run of one or more non-zero-valued coefficients, and for each such event, encoding the event with a codeword that for at least some events, relatively more likely-to-occur events are encoded by a shorter codeword than relatively less likely-to-occur events, and for each identified event, jointly encoding a plurality of consecutive values in the run of consecutive non-zero-valued coefficients, the joint encoding according to an amplitude coding method. The method is such that relatively short codewords are formed to represent values or sequences of values that are relatively more likely-to-occur, and relatively long codewords are formed to represent values or sequences of values that are relatively less likely-to-occur. The method is applicable to encoding a region in the series where there is likely to be a cluster of non-zero-valued coefficients.

Other features, advantages, and aspects will be apparent from the description and claims herein.

DETAILED DESCRIPTION

An aspect of the present invention introduced a multi-dimensional VLC to code multiple consecutive non-zero-valued coefficients that occur in runs of non-zero-valued coefficients ("clusters") in coding an ordered series of quantized coefficients of a transform of image data, as occurs in many image compression methods. Instead of using "m" one-dimensional VLC tables to code the amplitudes of "m" consecutive non-zero-valued coefficients, the invention uses a single "m" dimensional table to code the amplitudes of the entire "m" coefficients.

While the description is written in terms of an ordered series of digital values that are quantized transform coefficients of a block of image data, with zero-valued quantized coefficients being the most likely-to-occur, and quantized coefficients of value ±1 being the next likely-to-occur values, the invention is, in general, applicable to an ordered series of digital signals that each have an amplitude from a finite set of amplitudes consisting of the most-likely-to-occur amplitude and at least one other amplitude.

Figure 1:
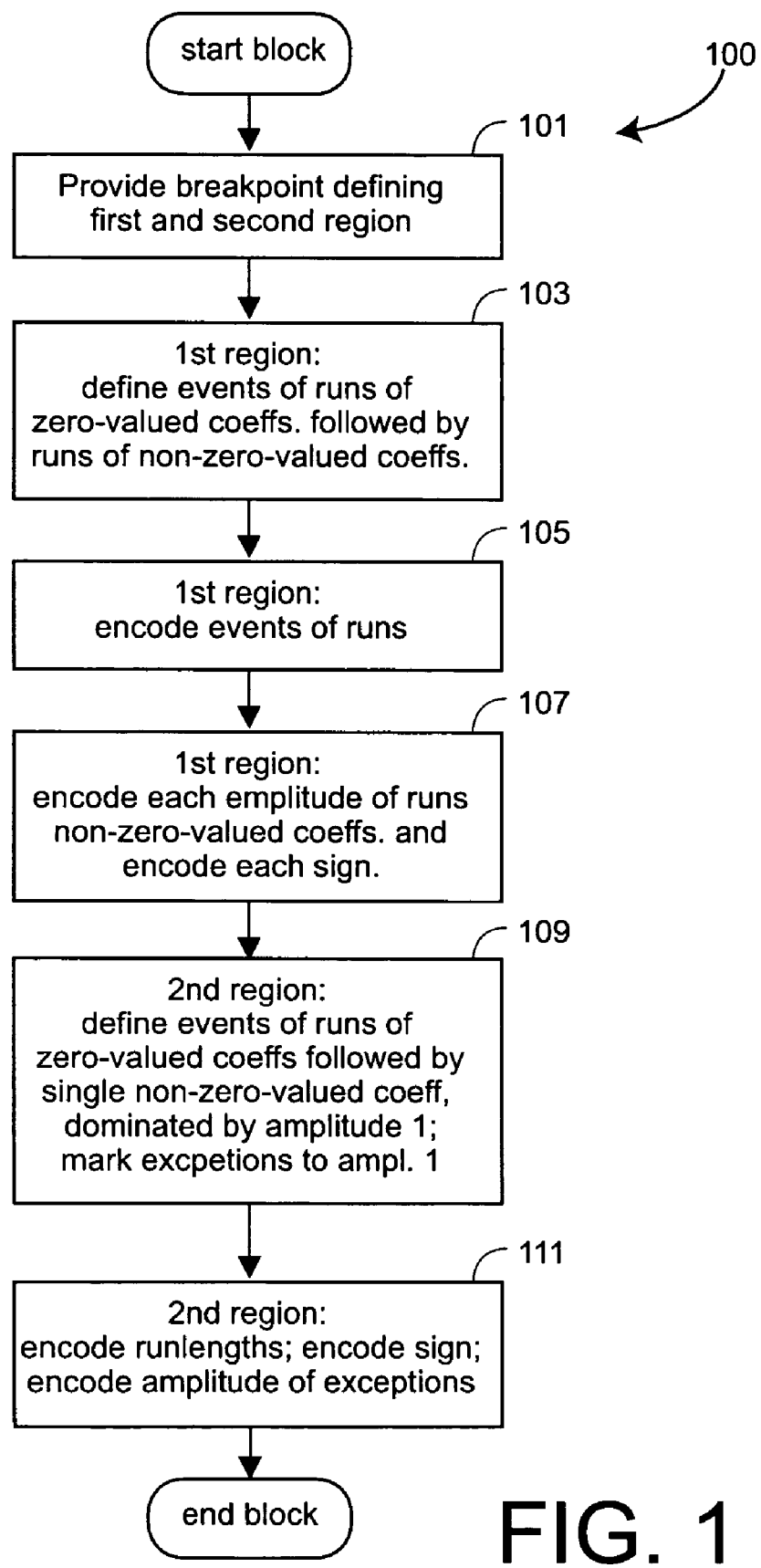
FIG. 1 shows a flow chart of one embodiment of a hybrid variable length coding (VLC) method which does not include multidimensional amplitude encoding of a plurality of amplitudes in a run of non-zero-valued coefficients.

FIG. 1 shows a flow chart of one embodiment of a hybrid variable length coding (VLC) method 100 that includes in 101 providing a breakpoint along the ordering of the series to define a first, e.g., low frequency region wherein non-zero-coefficients are likely to be clustered, and a second, e.g., high-frequency region where non-zero coefficients are likely to be scattered, and in the version shown, likely to be dominated by amplitude-1 coefficients. In 103, each run of zero-valued coefficients that precedes a run of one or more non-zero-valued coefficients is identified. In the case that the first region coding is according to an embodiment of the 2-D Non-Zero/Zero Cluster Coding Method, the events include a zero-valued coefficient following the run of non-zero-valued coefficients, and furthermore, events that have no non-zero-valued coefficients preceding the non-zero coefficient(s) are included. In 105, the identified events are encoded using joint encoding for each event of the runlength of the preceding zero-valued coefficient and the runlength of the one or more non-zero-valued coefficients. In one embodiment, 105 includes using a two-dimensional lookup table of codes. In 107, the individual amplitudes in each run of non-zero-amplitudes in the identified event is encoded using an amplitude code, which, in one embodiment is a variable length code obtained using a code table.

Note that in one variation, 103 and 105 are replaced by a first region coding method described in the Basic Hybrid Coding Method and the Extended Hybrid Coding Method.

In the version shown, the second, e.g., high frequency region is encoded as described in the Extended Hybrid Coding method. In 109, events are defined that are each a run of none or more zero-valued coefficients followed by a single non-zero-valued coefficient. Any such non-zero coefficient is assumed to have amplitude 1 such that no amplitude encoding is required for such a coefficient. A non-amplitude-1, non-zero coefficient is marked as an exception. Furthermore, the remainder of the block being zero is also identified. In 111, for each identified event in the second region, the runlength of the zero-valued coefficients preceding the single non-zero-valued coefficient is encoded using a variable length runlength coding method, implemented, e.g., as a coding table. The sign of the ending non-zero-value coefficient is encoded by a sign bit, and, in the case that the non-zero-valued coefficient is the exceptional case of not having amplitude 1, an exception code followed by an amplitude code is included. The amplitude code is obtained, e.g., using an amplitude coding table, which in general is different than the amplitude coding table used for encoding the non-zero-amplitudes in the first region, since the second region amplitudes are more likely to have lower value than the first region amplitudes.

Figure 2:
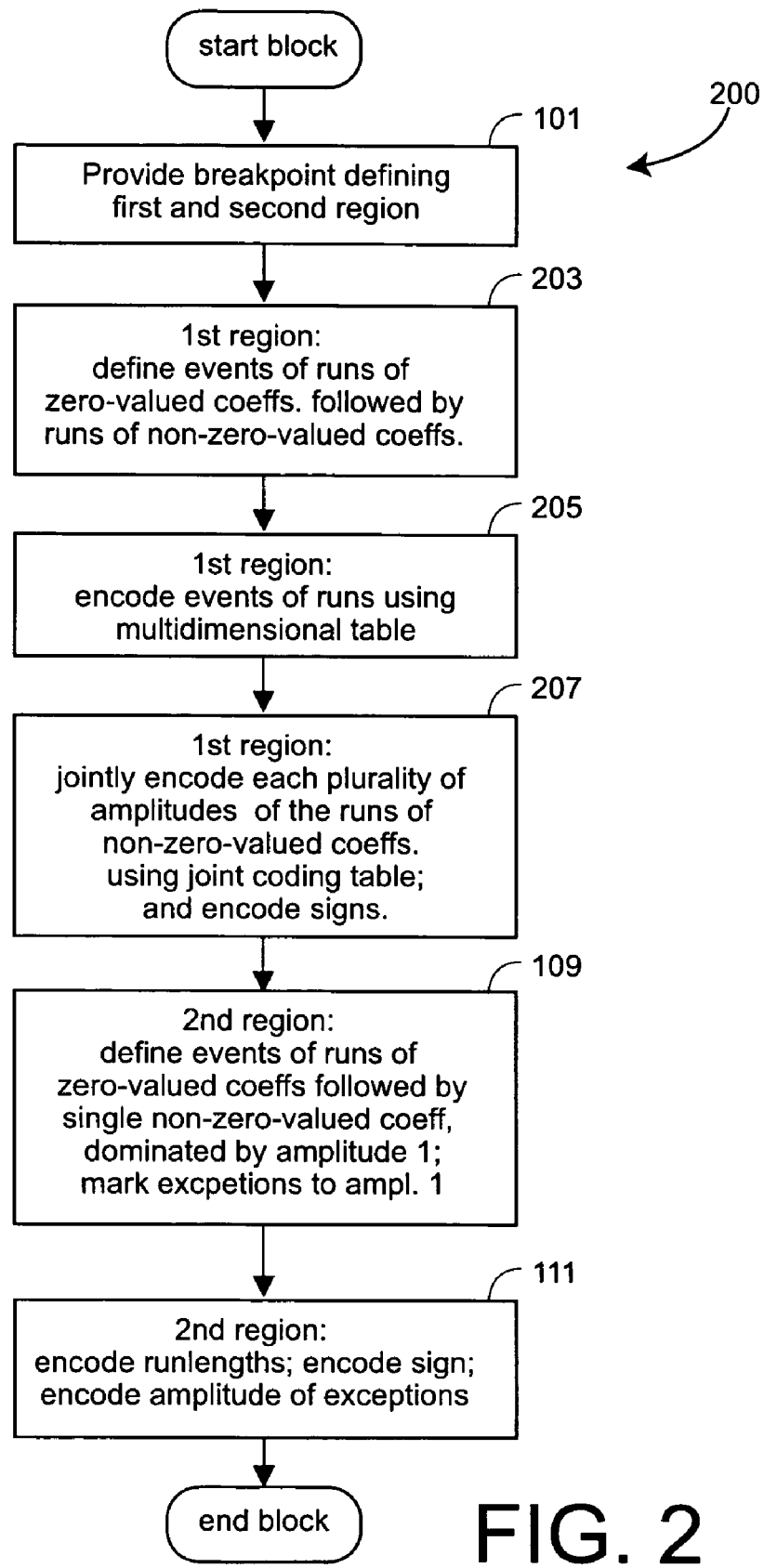
FIG. 2 shows a flow chart of one embodiment of a hybrid variable length coding (VLC) method, which includes joint multidimensional encoding of a plurality of amplitudes in a run of non-zero-valued coefficients.

In one variation, how to set up the codeword tables is described in the 2-D Non-Zero/Zero Cluster Coding Method, and includes either assuming or obtaining statistics for typical series of coefficient image blocks, or, in an adaptive system, by measurement of the relative frequencies of occurrence of events and amplitudes, depending on the coding method, e.g., code table. In another variation, how to set up the codes is described in the Basic Hybrid Coding Method and the Extended Hybrid Coding Method FIG. 2 shows a flow chart of another embodiment of a hybrid VLC method 200 that includes an aspect of the present invention, and includes instead of block 107 block 207, that for each recognized event in the first region, jointly encodes a plurality of the non-zero-amplitudes in runs of non-zero-valued coefficients by a codeword, e.g., using a joint coding table. The signs also are encoded.

Note that 203 and 205 correspond to 103 and 205, respectively, of FIG. 1, but use different reference numerals to indicate that these steps need not be identical. For example, FIG. 1 may include recognizing events as described in the variation as described in the Basic Hybrid Coding Method and the Extended Hybrid Coding Method, while 203 and 205 may be as described in the 2-D Non-Zero/Zero Cluster Coding Method.

As an example, assuming a pair of "z" consecutive zero-valued coefficients and "n" consecutive non-zero-valued coefficients, followed by a single non-zero-value, is coded using the coding invention described in the 2-D Non-Zero/Zero Cluster Coding Method. Denote the positions of the zero-valued/non-zero valued coefficients by R(z,n) and denote each of the amplitudes by m(1), m(2), . . . , m(n). Denote by C(z,n) the variable length codeword for the event R(z,n), z=0, 1 . . . , n=1, 2, . . . ; denote by A(a) the amplitude encoding of an amplitude a, a=1, 2, . . . , in the run of non-zero-valued coefficients in R(z,n); and denote by S(1), S(s), . . . , the sign bits for the first, second, . . . , n'th non-zero-valued coefficient in R(z,n). Then, according to one embodiment described in the 2-D Non-Zero/Zero Cluster Coding Method, the encoding of the event and the corresponding non-zero amplitudes is:

C(z,n)+A(m(1))+S(1)+A(m(2))+S(2)+ . . . +A(m(n))+ S(n), where + denoted concatenation.

Similarly, consider the Basic Hybrid Coding Method and the Extended Hybrid Coding Method. Denote by r(n) the run of n consecutive non-zero coefficients, and r'(z) the run of z consecutive zero-valued coefficients in the first region, n,z=1, 2, . . . . Consider a single event denoted by r(n), denote each of the non-zero amplitudes in r(n) by m(1), m(2), . . . , m(n). Denote by C(n) the variable length codeword for the run length of non-zero-valued coefficients in the event r(n), n=1, 2, . . . and C'(z) the variable length codeword for the run length of zero-valued coefficients in the event r'(z), z=1, 2, . . . ; denote by A(a) the amplitude encoding of an amplitude a, a=1, 2, . . . , in the run r(n) of non-zero-valued coefficients; and denote by S(1), S(s), . . . , the sign bits for the first, second, . . . , n'th non-zero-valued coefficient in r(n). Then according to embodiments described in the Basic Hybrid Coding Method and the Extended Hybrid Coding Method, the encoding of the event and the corresponding non-zero amplitudes is:

C(n)+A(m(1))+S(1)+A(m(2))+S(2)+ . . . +A(m(n))+S (n)+C'(z).

One aspect of the present invention is to use a single codeword obtained by a multidimensional amplitude encoding method to encode the sequence of amplitudes A(m(1)), A(m(2)), . . . , A(m(n)).

Denote by $A_n$(m(1), m(2), . . . , m(n)) the codeword for the sequence of n quantized amplitudes m(1), m(2), . . . , m(n), n=1, 2, . . . According to one embodiment of the invention, the event R(z,n) and associated amplitudes and signs is then, when using the 2-D Non-Zero/Zero Cluster Coding Method:

$$C(z,n)+A_n(m(1), m(2), \ldots, m(n))+S(1)+S(2)+\ldots+S(n),$$

and in one embodiment when using the Basic Hybrid Coding Method or the Extended Hybrid Coding Method:

$$C(n)+A_n(m(1), m(2), \ldots, m(n))+S(1)+S(2)+\ldots+S(n),$$

In one embodiment, the codeword for the sequence of n amplitudes is obtained using an n-dimensional code table, which in one embodiment, is an n-dimensional variable length code table.

In an alternate embodiment, the signs are incorporated into the multidimensional amplitude encoding method, which should then properly called a multidimensional quantized coefficient encoding method. Thus, the sign bit can be either integrated with the magnitude to represent the true amplitude or encoded as a separate bit as illustrated in this example.

In order to make the size of the multi-dimensional tables manageable from a practical implementation point of view, the maximum length of the run of non-zero amplitudes jointly encoded is restricted to relatively low numbers such as 2 or 3. Suppose at most three coefficients are jointly encoded, and suppose multidimensional tables are used. One embodiment uses a one-dimensional amplitude coding table for events with a runlength of one non-zero-coefficient, a two-dimensional amplitude coding table for events with a runlength of two non-zero-coefficients, and a three-dimensional amplitude coding table for events with a runlength of three non-zero-coefficients.

The more likely-to-occur amplitude combinations use variable length codes. These codes are obtained by assuming or measuring statistics of combinations, and assigning variable length codewords according to the assumed or measured statistics, using code allocation methods known in the art, e.g., Huffman codes, non-Huffman Arithmetic codes, and so forth. Furthermore, in one embodiment, some of the less-likely-to-occur amplitude combinations are assigned a fixed length code preceded by an escape code.

When at most three consecutive non-zero amplitudes are jointly encoded, in one embodiment, for longer runs, the remaining 4th, 5th, etc. non-zero coefficients' amplitudes are each encoded using one-dimensional tables as described in the 2-D Non-Zero/Zero Cluster Coding Method.

In an alternate implementation, further multidimensional tables are used for these later coefficients. In one version, the later multidimensional tables are the same as the first used table, and in another implementation, different tables are used for the later groups of coefficients to account for the likelihood that the amplitudes are usually smaller the later the coefficient is in the ordering of the series.

Figure 3A:
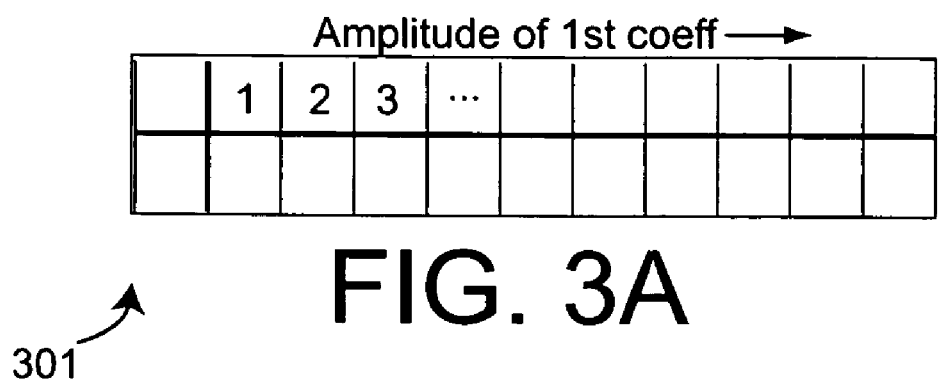
FIGS. 3A, 3B, and 3C respectively show a one-dimensional amplitude code table for a single amplitude, a two-dimensional amplitude code table for the amplitudes two consecutive coefficients, and a three-dimensional amplitude code table for the amplitudes three consecutive coefficients, according to an aspect of the invention.
Figure 3B:
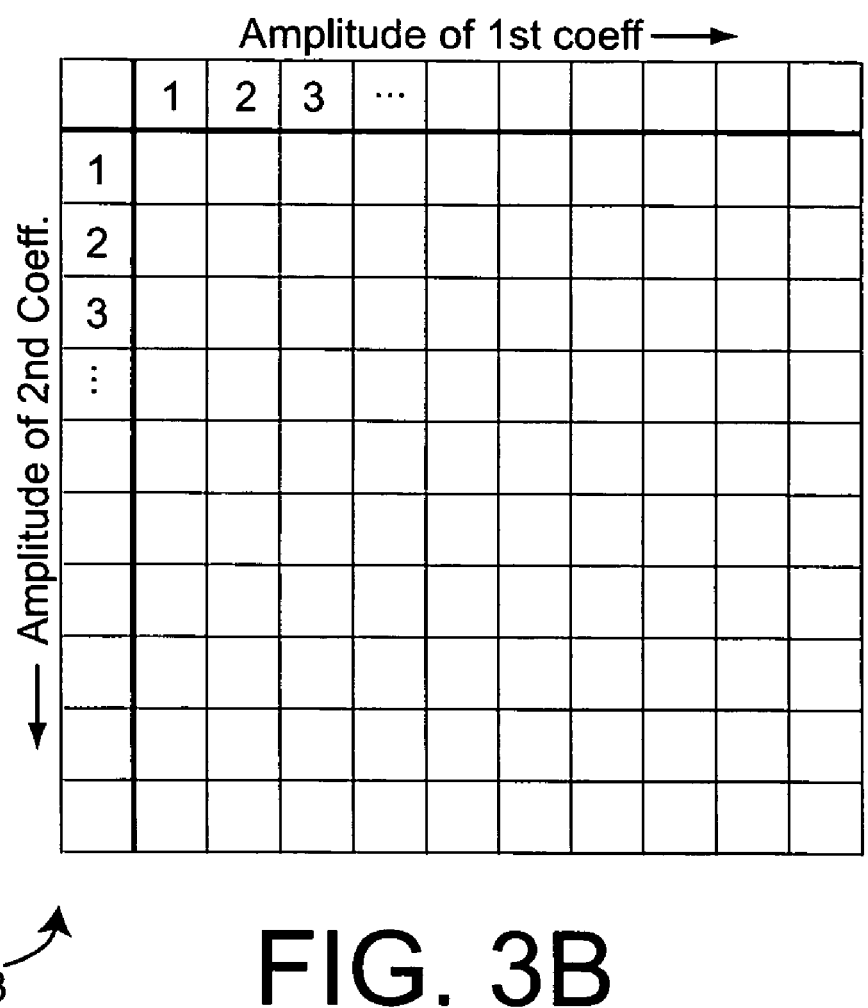
Figure 3C:
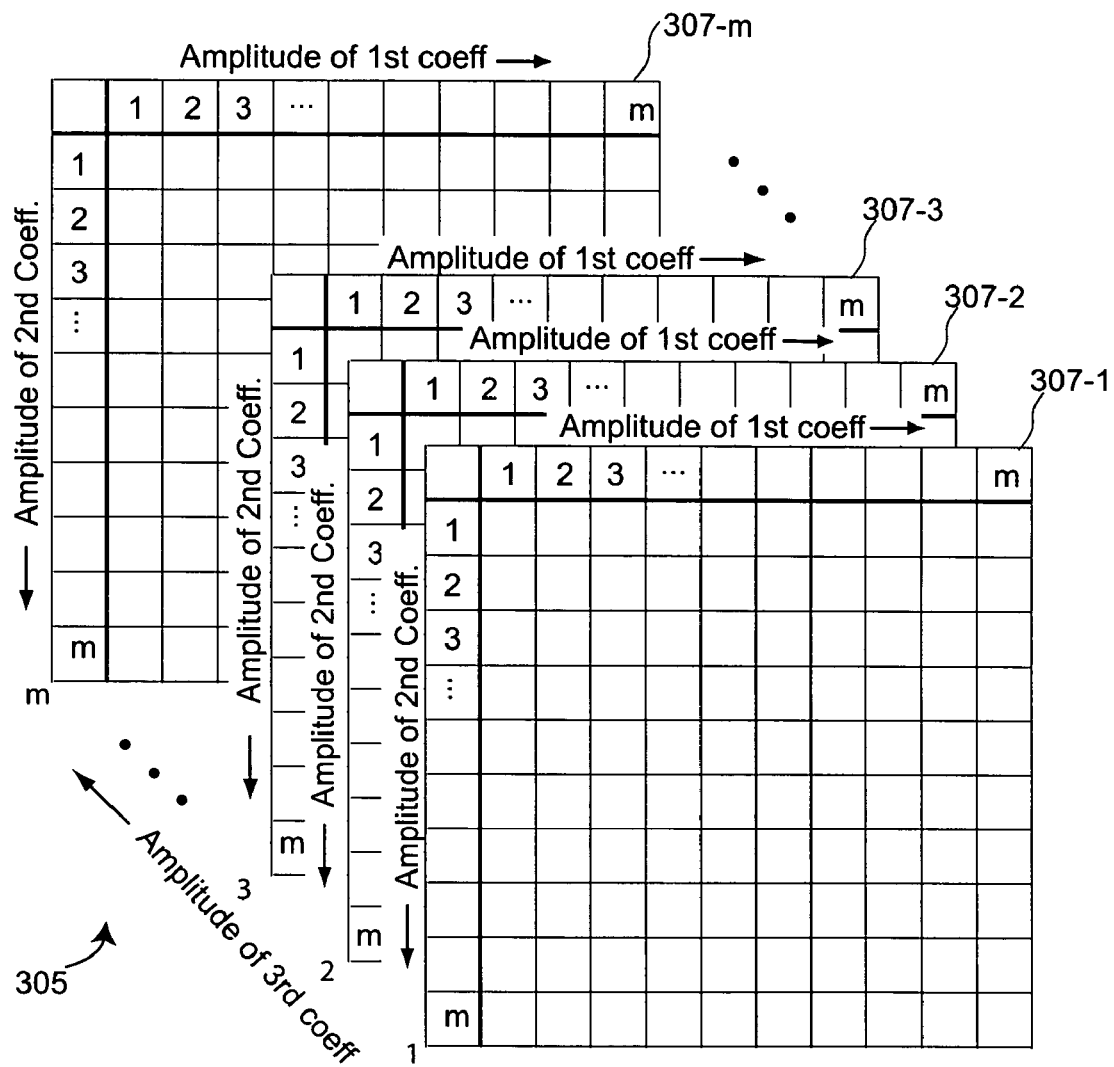
Figure 3D:
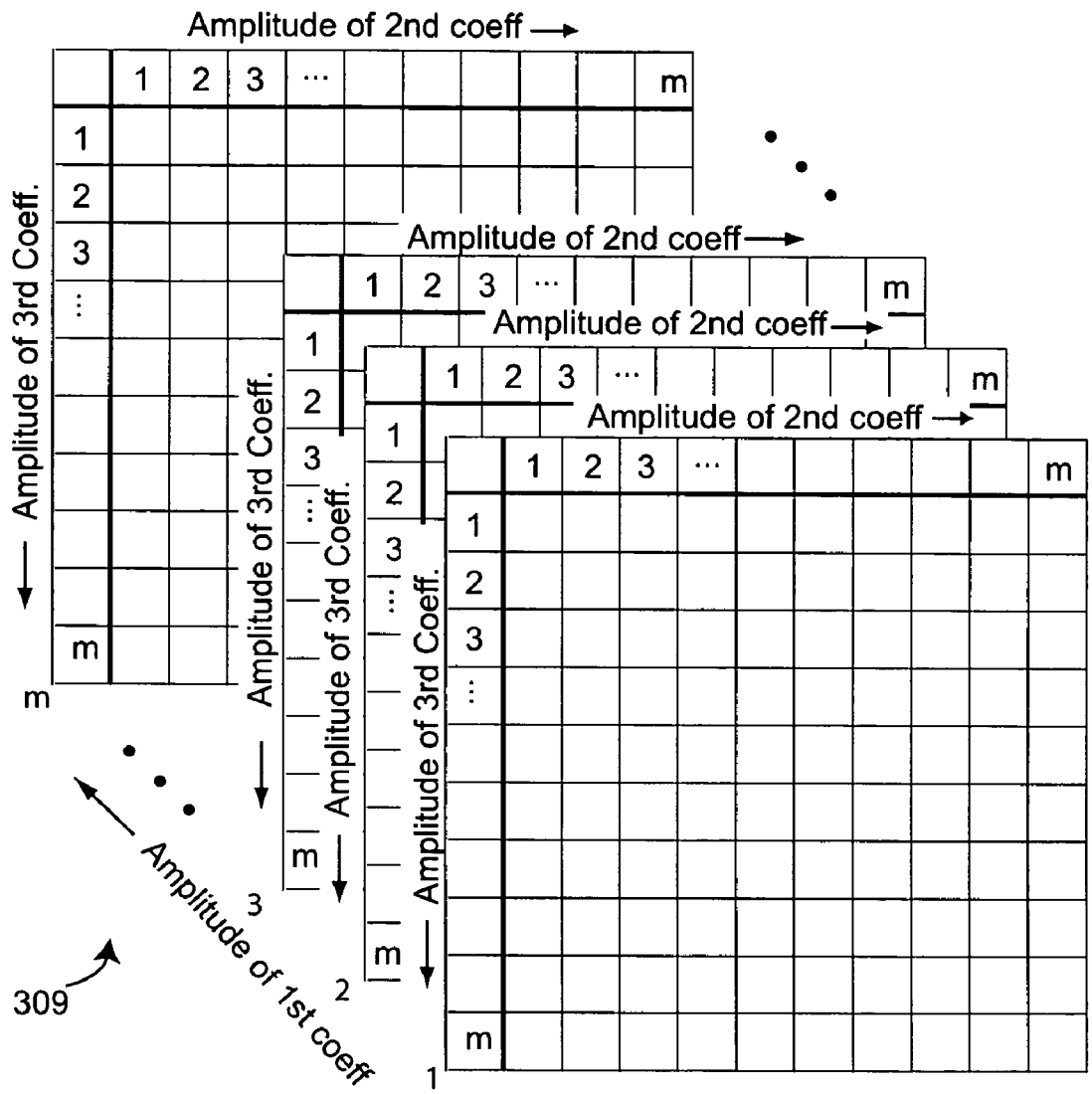
FIG. 3D shows a three-dimensional amplitude code table similar to FIG. 3C using an alternate arrangement of coefficients amplitudes for each 2D table.

FIGS. 3A, 3B, and 3C respectively show a one-dimensional amplitude code table 301, a two-dimensional amplitude code table 303, and a three-dimensional amplitude code table 305. The three-dimensional amplitude code table 305, in one embodiment, stores as a set of two-dimensional amplitude code tables 307-1, 307-2, 307-3, . . . , 307-m, where m denotes the largest value of the each of the first, second, and third coefficients. Each 2D table stores a table for different third coefficient amplitudes providing the codes for different amplitudes of the first and second coefficients. When the three-dimensional code table is stored as a set of two-dimensional code tables, which coefficients' amplitudes are in each two-dimensional table may be different. FIG. 3D shows an alternate table 309 using a different set: each 2D table stores a table for different first coefficient amplitudes providing the codes for different amplitudes of the second and third coefficients. Each coefficient value is restricted to m in this table.

Regarding the joint encoding of identified events according to the 2-D Non-Zero/Zero Cluster Coding Method, in one version, each identified event only includes up to a pre-determined number of coefficients, called the maximal length herein, such that some events of the maximal length include a first run of one or more consecutive non-zero-valued coefficients not followed by a single zero-valued coefficient, followed by a second run of consecutive none or more zero-valued coefficients. This provides for encoding an event with more than the pre-determined number of coefficients as a plurality of events of at most the maximal length without using escape codes. Two or more events that together define a run of less than the maximal length zero-valued coefficients followed by a run of any length of non-zero-valued coefficients is called a "generalized event" herein in that it is treated as a single event for some purposes, including, for example, establishing the first and second region using what is called a soft boundary.

EXAMPLE

As an example, consider the following series.
5  0000+3−4−20 000000+30 000000|000000 000000 00−10 000000000000+10 000000000000.

Suppose that a breakpoint exists at the point indicated by "|" and consider encoding the coefficients in the first region with an embodiment of the 2-D Non-Zero/Zero Cluster Coding Method, with a code provided for all zeroes. The first region is:
5 0000+3−4−20 000000+30 000000.

Denote by DC(m) the codeword for the DC amplitude, and denote by C(z,n) the variable length codeword for the event R(z,n), z=0, 1, . . . , n=1, 2, . . . , of z zero-valued-coefficients followed by n non-zero-valued coefficients followed by a single zero-valued coefficient. Further denote by C(skip) the codeword for "skip to boundary". Consider an embodiment in which the signs are separately encoded by a set of sign bits. Let $S_+$ and $S_-$ denote the code bits for a positive and negative amplitude, respectively. Further denote by $A_n(m(1), m(2), \ldots, m(n))$ the codeword for the sequence of n quantized amplitudes $m(1), m(2), \ldots, m(n)$, n=1, 2, . . . .

Then according to an embodiment of the invention, the codewords for the first region are:

$$DC(5)+C(4,3)+A_3(3,4,2)+S_++S_-+S_-+C(6,1)+A_1(3)+S_{++C(skip)},$$

where + denotes concatenation.

How to establish the breakpoint is described in the Basic Hybrid Coding Method. One version uses a fixed breakpoint between the first, e.g., low frequency region, and the second, e.g., high frequency region. In one embodiment, the fixed breakpoint is pre-determined for each type of image and for each type of compression method by running experiments collecting statistics on a set of typical samples of such images. Typically, different breakpoints are determined for:

intraframe and still image coding vs. interframe coding;
    standard definition television images (SDTV) vs. HDTV images;
    high bit rate coding methods vs. low bit rate coding methods;
    DCT vs. non-DCT transforms;
    and so forth.

When fixed breakpoints are used, there is already an indication passed on to the decoder to indicate the type of image, e.g., whether interframe or intraframe. Thus, there is typically no need to send a further indication to the decoder of the breakpoint.

The inventors performed experiments on typical still images—applicable also to intraframe images in motion coding—by performing variable length coding according to embodiments of the present invention, and plotting the size of the compressed image for different breakpoint values for the case of 8 by 8 blocks quantized to 127 non-zero amplitudes using the DCT, and observed that a breakpoint of 22 worked for most images, although some images worked well with a breakpoint of about 12. Therefore, in one embodiment for intraframe and still images for DCT transform coding, a pre-selected fixed breakpoint of 22 was used.

In a first variation, the breakpoint is image dependent and selected from a finite set according to a breakpoint selection criterion. For example, from the above-described experiments, the compression using a first breakpoint of 22 was compared to the compression using a second breakpoint of 10, and the breakpoint that gave the higher compression was used. Other breakpoint selection criteria also are possible, e.g., by looking at the statistics of runs of zero-valued coefficients and non-zero-valued coefficients.

When such an image-dependent breakpoint is used, an indication of the breakpoint is also sent with each set of coefficients. In one embodiment, a 2-bit indication is sent. This provides for each block to be encoded using one of 4 pre-defined breakpoints. In an alternate embodiment, the indication of which pre-defined breakpoint is sent as a variable length code such that more common breakpoints are encoded by a shorter code.

While typically, the set of possible breakpoints is a small subset of the possible positions in the series, in yet another variation, the image dependent breakpoint is selected from anywhere in the series, or, in an alternate variation, from anywhere along a subrange.

In an improved embodiment, instead of the breakpoint defining a fixed boundary between the first and second region, called a "hard" boundary herein, or a set of breakpoints defining a set of hard breakpoints, such that an event or generalized event that includes a sequence of up to the maximal length of consecutive zero-valued coefficients followed by a run of non-zero values that crossed the breakpoint would be regarded as a generalized event in the first region up to the breakpoint. In such a case, the breakpoint defines what is called herein a "soft" boundary in that any event that started in the first region would be encoded in the first region even if it crossed the breakpoint. Thus, the actual boundary for a particular block of coefficients might extend beyond the breakpoint.

Apparatus

Figure 4:
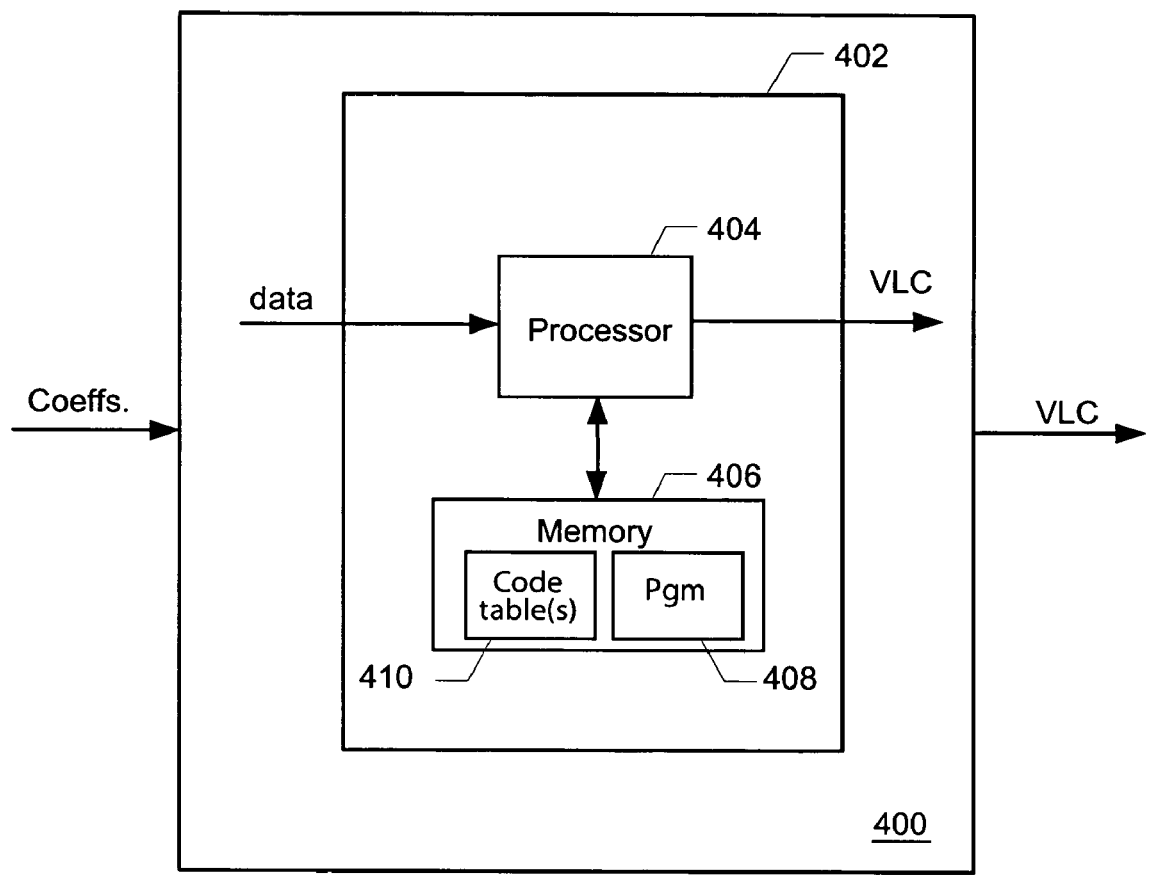
FIG. 4 shows an apparatus embodiment that includes a processing system with a processor and a memory implementing the coding methods described herein.

Another aspect of the invention is an apparatus for coding a series of digital signals, e.g., an ordered series of quantized coefficients of a transformed block of image data. FIG. 4 shows an apparatus 400 that includes a processing system 402 that includes one or more processors 404 and a memory 406. A single processor is shown in FIG. 4 and those in the art will appreciate that this may represent several processors. Similarly, a single memory subsystem 406 is shown, and those in the art will appreciate that the memory subsystem may include different elements such as RAM, ROM, and so forth. In addition, the memory subsystem is meant to include any non-volatile memory storage such as a magnetic or optical storage component. A computer program 408 is included and is loaded into the memory 406. Note that at any time, some of the program may be in the different parts of the memory subsystem, as will be understood by those in the art. The program 408 includes instructions to instruct the processor to implement, in different versions, the different coding methods described above. The processor thus accepts as data the ordered coefficients and generates the codewords. The apparatus 400 further includes in the memory subsystem 406 a coding data structure 410 that provides the codewords for sets of one or more coefficients as described in any one of the novel coding methods described herein. In one embodiment, the data structure is in the form of one or more tables.

Note that FIG. 4 does not show details such as bus structures, I/O structures, etc., that may be included since the need for such structures would be known to those in the art and their inclusion would only obscure the inventive aspects of the apparatus. Furthermore, the processing system may be implemented using one or more general purpose microprocessors, one or more microcontrollers that include several memory and other elements, one or more DSP devices, or any other programmable processors. Furthermore, the processors may be standalone devices, or may be implemented as "cores" to be included in an ASIC, gate array, or other device.

Another aspect of the invention is a memory (such as memory 406 in FIG. 4) that stores a coding data structure that provides the codewords for sets of one or more coefficients as described in any one of the novel coding methods described herein. In one embodiment, the data structure is in the form of one or more tables.

Thus, a variable length coding method and apparatus has been described suitable for encoding the quantized transform coefficients of blocks of images as occur in common image compression methods.

One embodiment of each of the methods described herein is in the form of a computer program that executes on a processing system, e.g., one or more processors that are part of an image coder. Thus, as will be appreciated by those skilled in the art, embodiments of the present invention may be embodied as a method, an apparatus such as a special purpose apparatus, an apparatus such as a data processing system, or a carrier medium carrying computer readable code, e.g., a computer program product or a carrier wave. The carrier medium carries one or more computer readable code segments for instructing a processing system to implement a method. Accordingly, aspects of the present invention may take the form of a method, an entirely hardware embodiment, an entirely software embodiment or an embodiment combining software and hardware aspects. Furthermore, the present invention may take the form of a carrier medium (e.g., a computer program product on a computer-readable storage medium or a carrier wave) carrying computer-readable program code segments embodied in or carried by the medium.

While the carrier medium is shown in an exemplary embodiment to be a single medium, the term "carrier medium" should be taken to include a single medium or multiple media (e.g., in a centralized or distributed database, and/or associated caches and servers) that store the one or more sets of instructions. The term "carrier medium" shall also be taken to include any medium that is capable of storing, encoding or carrying a set of instructions for execution by the machine and that cause the machine to perform any one or more of the methodologies of the present invention. A carrier medium may take many forms, including but not limited to, non-volatile media, and/or volatile media. Non-volatile media includes, for example, optical, magnetic disks, and magneto-optical disks. Volatile media includes dynamic memory, such as main memory. For example, the term "carrier medium" shall accordingly be taken to include, but not be limited to, solid-state memories, optical media, and/or magnetic media.

It will be understood that the methods discussed are performed in one embodiment by an appropriate processor (or processors) of a processing (i.e., computer) system executing instructions (code segments) stored in storage. It will also be understood that the invention is not limited to any particular implementation or programming technique and that the invention may be implemented using any appropriate techniques for implementing the functionality described herein. The invention is not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

It should further be appreciated that although the invention has been described in the context of transform encoding of images, the invention is not limited to such contexts and may be utilized in various other compression applications and systems. Furthermore, the invention is not limited to any one type of architecture or type of transform encoding. For example, the DCT is mentioned above as one transform. Other transforms may be used, e.g., the new H.264/MEG-4 AVC video coding standard/draft standard defines 4×4 blocks and a DCT-like 4×4 integer transform. The invention does not depend on any particular type of interframe coding if used, or of motion compensation if used for interframe coding, or any intra-estimation if used for estimating the pixels of a block using information from neighboring blocks.

Note that variable length coding is sometimes referred to as entropy coding or statistical coding.

Note that in one embodiment for amplitude encoding, 127 possible non-zero values are possible for the coefficients. The invention however is not restricted to any number of possible quantization values.

Note also that the term amplitude is irrespective of sign. Therefore, for example, coefficient of values +1 and −1 both have amplitude 1.

Note that the terms coding and encoding are used interchangeably herein.

Note also that the present invention does not depend on the particular type of VLC used for any of the coding methods, e.g., the coding tables, and can work, for example, with Huffman coding and with arithmetic coding methods. Furthermore, while embodiments have been described that used fixed encoding for the events based on assumed or a priori likelihoods of occurrence of the events (also called the symbols), i.e., the likelihoods of occurrence of the events do not change, other embodiments use adaptive encoding, i.e., the encoding is changeable according to statistical data such as histograms collected from the actual coefficients.

All publications, patents, and patent applications cited herein are hereby incorporated by reference.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. A method of operating an apparatus to process an ordered series of digital signals that each has a value that includes an amplitude from a finite set of amplitudes consisting of the most-likely-to-occur amplitude and at least one other amplitude, the processing to reduce the amount of data used to represent the digital signals and to form codewords such that the more likely-to-occur values or sequences of values of digital signals are represented by relatively short codewords and the less likely-to-occur values or sequences of values of digital signals are represented by relatively long codewords, the method comprising:

for a first contiguous region in the series:
identifying events that each includes a run of one or more consecutive signals having any value other than the most-likely-to-occur amplitude;
for each identified event, encoding the event with an event codeword that for at least some events, relatively more likely-to-occur events are encoded by a shorter event codeword than relatively less likely-to-occur events; and
for each identified event, jointly encoding a plurality of consecutive values in the run of one or more consecutive signals having other than the most-likely-to-occur amplitude, the jointly encoding being according to an amplitude coding method and generating an amplitude codeword, such that relatively short amplitude codewords are formed to represent values or sequences of values that are relatively more likely-to-occur, and relatively long amplitude codewords are formed to represent values or sequences of values that are relatively less likely-to-occur, such that codewords representing the first contiguous region can include both one or more event codewords and one or more amplitude codewords.

2. A method as recited in claim 1,
wherein the series of digital signals is a series of quantized coefficients of a transformed block of image data formed by a transform such that the most-likely-to-occur amplitude is 0, and the next most-likely-to-occur amplitude is 1, such that the identifying of events identifies events that each includes a run of one or more non-zero-valued coefficients.

3. A method as recited in claim 2, wherein the transformed block of image data includes a DC term, and wherein the DC term is separately encoded, such that the series of digital signals is a set of non-DC quantized coefficients of a transformed block of image data.

4. A method as recited in claim 2, wherein the jointly encoding a plurality of consecutive values includes jointly encoding a plurality of amplitudes, and separately encoding the signs of the amplitudes.

5. A method as recited in claim 2, wherein the jointly encoding a plurality of consecutive values includes jointly encoding a plurality of amplitudes including the signs of the amplitudes, such that no separate sign encoding is used for the consecutive values that are jointly encoded.

6. A method as recited in claim 2, wherein the jointly encoding a plurality of consecutive values includes using a multidimensional coding table.

7. A method as recited in claim 2,
wherein the identifying events includes identifying events that each includes a run of consecutive zero-valued coefficients, preceding a run of one or more consecutive non-zero-valued coefficients, including events of no zero-valued coefficients preceding a run of one or more consecutive non-zero-valued coefficients; and
wherein the jointly encoding includes jointly encoding the run lengths of the preceding run of zero-valued coefficients and the following run of non-zero-valued coefficients, such that for at least some events, relatively more likely-to-occur pairs of runlengths are encoded by a shorter codeword than relatively less likely-to-occur runlengths.

8. A method as recited in claim 7, further comprising:
providing a breakpoint to define the first contiguous region along the ordering of the series followed by a second contiguous region; such that the coefficients of the first region are encoded by a first encoding method that includes the identifying of events, the jointly encoding the runlengths of the events, and the encoding the amplitudes of non-zero-valued coefficients of the events; and
encoding the coefficients in the second region using a second region encoding method, and
wherein the first region encoding method and the second region encoding method are such that the encoding of at least some of the coefficients or runs of coefficients in the first region is different than the encoding of at least some of the coefficients or runs of coefficients in the second region.

9. A method as recited in claim 8, wherein the breakpoint value is pre-selected.

10. A method as recited in claim 8, wherein the breakpoint value is selected from a finite set of pre-defined breakpoint values according to an image-dependent criterion.

11. A method as recited in claim 8, wherein the second corresponding method is applicable to intraframe image data and to interframe blocks of image data, and wherein a first pre-selected breakpoint value is used for intraframe image data and a second pre-selected breakpoint value is used for interframe image data.

12. A method as recited in claim 8, wherein the breakpoint defines a hard boundary between the first and second regions.

13. A method as recited in claim 8, wherein the breakpoint defines a soft boundary between the first and second regions, such that for an identified event in the first region block having a sequence of consecutive non-zero values that crosses the breakpoint, the boundary between the first and second region is at the end of the event such that the whole event is in the first region.

14. A method as recited in claim 7, wherein the joint encoding of the runlengths on an event uses a multidimensional coding table.

15. A method as recited in claim 7, wherein the number of events that are identified and whose run lengths jointly encoded is limited such that only events up to a maximum total number of coefficients (the "maximal length") are identified, and wherein the identifying also identifies events of all zeroes of the maximum length, and maximal length events that end in a non-zero-coefficient, such that escape codes may be avoided in coding the coefficients of the first region.

16. A method as recited in claim 2,
wherein the identifying events includes identifying the runlengths of one or more zero-valued coefficients and identifying the runlengths of one or more non-zero-valued coefficients that follow the runlengths of zero-valued coefficients; and
wherein the encoding of the events, including encoding the runlengths of identified runs of non-zero-valued coefficients, uses a first runlength coding method, and encoding the runlengths of identified runs of zero-valued coefficients uses a second runlength coding method,
such that for at least some events, relatively more likely-to-occur pairs of runlengths are encoded by a shorter codeword than relatively less likely-to-occur runlengths.

17. A computer readable hardware medium having instructions coded thereon that when executed by one or more processors cause execution of a method for processing an ordered series of digital signals that each has a value including an amplitude from a finite set of amplitudes consisting of the most-likely-to-occur amplitude and at least one other amplitude, the processing to reduce the amount of data used to represent the digital signals and to form codewords such that the more likely-to-occur values or sequences of values of digital signals are represented by relatively short codewords and the less likely-to-occur values or sequences of values of digital signals are represented by relatively long codewords, the method comprising:
for a first contiguous region in the series:
identifying events that each includes a run of one or more consecutive signals having any value other than the most-likely-to-occur amplitude;
for each identified event, encoding the event with an event codeword that for at least some events, relatively more likely-to-occur events are encoded by a shorter event codeword than relatively less likely-to-occur events; and
for each identified event, jointly encoding a plurality of consecutive values in the run of one or more consecutive signals having other than the most-likely-to-occur amplitude, the jointly encoding being according to an amplitude coding method and generating an amplitude codeword, such that relatively short amplitude codewords are formed to represent values or sequences of values that are relatively more likely-to-occur, and relatively long amplitude codewords are formed to represent values or sequences of values that are relatively less likely-to-occur,
such that codewords representing the first contiguous region can include both one or more event codewords and one or more amplitude codewords.

18. A computer readable hardware medium as recited in claim 17,
wherein the series of digital signals is a series of quantized coefficients of a transformed block of image data formed by a transform such that the most-likely-to-occur amplitude is 0, and the next most-likely-to-occur amplitude is 1, such that the identifying of events identifies events that each includes a run of one or more non-zero-valued coefficients.

19. A computer readable hardware medium as recited in claim 18, wherein the transformed block of image data includes a DC term, and wherein the DC term is separately encoded, such that the series of digital signals is a set of non-DC quantized coefficients of a transformed block of image data.

20. A computer readable hardware medium as recited in claim 18, wherein the jointly encoding a plurality of consecutive values includes jointly encoding a plurality of amplitudes, and separately encodes the signs of the amplitudes.

21. A computer readable hardware medium as recited in claim 18, wherein the jointly encoding a plurality of consecutive values includes jointly encoding a plurality of amplitudes including the signs of the amplitudes, such that no separate sign encoding is used for the consecutive values that are jointly encoded.

22. A computer readable hardware medium as recited in claim 18, wherein the jointly encoding a plurality of consecutive values includes using a multidimensional coding table.

23. A computer readable hardware medium as recited in claim 18,
wherein the identifying events includes identifying events that each includes a run of consecutive zero-valued coefficients, preceding a run of one or more consecutive non-zero-valued coefficients, including events of no zero-valued coefficients preceding a run of one or more consecutive non-zero-valued coefficients; and
wherein the jointly encoding includes jointly encoding the run lengths of the preceding run of zero-valued coefficients and the following run of non-zero-valued coefficients, such that for at least some events, relatively more likely-to-occur pairs of runlengths are encoded by a shorter codeword than relatively less likely-to-occur runlengths.

24. A computer readable hardware medium as recited in claim 23, the method further comprising:
providing a breakpoint to define the first contiguous region along the ordering of the series followed by a second contiguous region; such that the coefficients of the first region are encoded by a first encoding method that includes the identifying of events, the jointly encoding the runlengths of the events, and the encoding the amplitudes of non-zero-valued coefficients of the events; and
encoding the coefficients in the second region using a second region encoding method, and
wherein the first region encoding method and the second region encoding method are such that the encoding of at least some of the coefficients or runs of coefficients in the first region is different than the encoding of at least some of the coefficients or runs of coefficients in the second region.

25. A computer readable hardware medium as recited in claim 24, wherein the breakpoint value is pre-selected.

26. A computer readable hardware medium as recited in claim 24, wherein the breakpoint value is selected from a finite set of pre-defined breakpoint values according to an image-dependent criterion.

27. A computer readable hardware medium as recited in claim 24, wherein the second corresponding method is applicable to intraframe image data and to interframe blocks of image data, and wherein a first pre-selected breakpoint value is used for intraframe image data and a second pre-selected breakpoint value is used for interframe image data.

28. A computer readable hardware medium as recited in claim 24, wherein the breakpoint defines a hard boundary between the first and second regions.

29. A computer readable hardware medium as recited in claim 24, wherein the breakpoint defines a soft boundary between the first and second regions, such that for an identified event in the first region block having a sequence of consecutive non-zero values that crosses the breakpoint, the boundary between the first and second region is at the end of the event such that the whole event is in the first region.

30. A computer readable hardware medium as recited in claim 23, wherein the joint encoding of the runlengths on an event uses a multidimensional coding table.

31. A computer readable hardware medium as recited in claim 23, wherein the number of events that are identified and whose run lengths jointly encoded is limited such that only events up to a maximum total number of coefficients (the "maximal length") are identified, and wherein the identifying also identifies events of all zeroes of the maximum length, and maximal length events that end in a non-zero-coefficient, such that escape codes may be avoided in coding the coefficients of the first region.

32. A computer readable hardware medium as recited in claim 18,
wherein the identifying events includes identifying the runlengths of one or more zero-valued coefficients and identifying the runlengths of one or more non-zero-valued coefficients that follow the runlengths of zero-valued coefficients; and
wherein the encoding of the events, including encoding the runlengths of identified runs of non-zero-valued coefficients, uses a first runlength coding method, and encoding the runlengths of identified runs of zero-valued coefficients uses a second runlength coding method, such that for at least some events, relatively more likely-to-occur pairs of runlengths are encoded by a shorter codeword than relatively less likely-to-occur runlengths.

33. An apparatus for processing an ordered series of digital signals that each has a value including an amplitude from a finite set of amplitudes consisting of the most-likely-to-occur amplitude and at least one other amplitude, the processing to reduce the amount of data used to represent the digital signals and to form codewords such that the more likely-to-occur values or sequences of values of digital signals are represented by relatively short codewords and the less likely-to-occur values or sequences of values of digital signals are represented by relatively long codewords, the apparatus comprising:
means for identifying, in a first contiguous region in the series, events that each includes a run of one or more consecutive signals having any value other than the most-likely-to-occur amplitude;
means for encoding, for each identified event, the event with an event codeword that for at least some events, relatively more likely-to-occur events are encoded by a shorter event codeword than relatively less likely-to-occur events; and
means for jointly encoding, for each identified event, a plurality of consecutive values in the run of one or more consecutive signals having other than the most-likely-to-occur amplitude, the jointly encoding being according to an amplitude coding method and generating an amplitude codeword, such that relatively short amplitude codewords are formed to represent values or sequences of values that are relatively more likely-to-occur, and relatively long amplitude codewords are formed to represent values or sequences of values that are relatively less likely-to-occur, such that codewords representing the first contiguous region can include both one or more event codewords and one or more amplitude codewords.

34. An apparatus as recited in claim 33, wherein the series of digital signals is a series of quantized coefficients of a transformed block of image data formed by a transform such that the most-likely-to-occur amplitude is 0, and the next most-likely-to-occur amplitude is 1, such that the means for identifying of events identifies events that each includes a run of one or more nonzero-valued coefficients.

35. An apparatus as recited in claim 34, wherein the transformed block of image data includes a DC term, and wherein the DC term is separately encoded, such that the series of digital signals is a set of non-DC quantized coefficients of a transformed block of image data.

36. An apparatus as recited in claim 34, wherein the means for jointly encoding a plurality of consecutive values jointly encodes a plurality of amplitudes, and separately encodes the signs of the amplitudes.

37. An apparatus as recited in claim 34, wherein the means for jointly encoding a plurality of consecutive values jointly encodes a plurality of amplitudes including the signs of the amplitudes, such that no separate sign encoding is used for the consecutive values that are jointly encoded.

38. An apparatus as recited in claim 34, wherein the means for jointly encoding a plurality of consecutive values uses a multidimensional coding table.

39. An apparatus as recited in claim 34,
wherein the means for identifying events includes means for identifying events that each includes a run of consecutive zero-valued coefficients, preceding a run of one or more consecutive non-zero-valued coefficients, including events of no zero-valued coefficients preceding a run of one or more consecutive non-zero-valued coefficients; and
wherein the means for jointly encoding includes means for jointly encoding the run lengths of the preceding run of zero-valued coefficients and the following run of non-zero-valued coefficients, such that for at least some events, relatively more likely-to-occur pairs of runlengths are encoded by a shorter codeword than relatively less likely-to-occur runlengths.

40. An apparatus as recited in claim 39, the apparatus further comprising:
means for providing a breakpoint to define the first contiguous region along the ordering of the series followed by a second contiguous region;
such that the coefficients of the first region are encoded by a first encoding method that includes the identifying of events, the jointly encoding the runlengths of the events, and the encoding the amplitudes of non-zero valued coefficients of the events; and
means for encoding the coefficients in the second region using a second region encoding method, and
wherein the first region encoding method and the second region encoding method are such that the encoding of at least some of the coefficients or runs of coefficients in the first region is different than the encoding of at least some of the coefficients or runs of coefficients in the second region.

41. An apparatus as recited in claim 40, wherein the breakpoint value is pre-selected.

42. An apparatus as recited in claim 40, wherein the breakpoint value is selected from a finite set of pre-defined breakpoint values according to an image-dependent criterion.

43. An apparatus as recited in claim 40, wherein the second corresponding method is applicable to intraframe image data and to interframe blocks of image data, and wherein a first pre-selected breakpoint value is used for intraframe image data and a second pre-selected breakpoint value is used for interframe image data.

44. An apparatus as recited in claim 40, wherein the breakpoint defines a hard boundary between the first and second regions.

45. An apparatus as recited in claim 40, wherein the breakpoint defines a soft boundary between the first and second regions, such that for an identified event in the first region block having a sequence of consecutive non-zero values that crosses the breakpoint, the boundary between the first and second region is at the end of the event such that the whole event is in the first region.

46. An apparatus as recited in claim 39, wherein the means for joint encoding of the runlengths on an event uses a multidimensional coding table.

47. An apparatus as recited in claim 39, wherein the number of events that are identified and whose run lengths jointly encoded is limited such that only events up to a maximum total number of coefficients (the "maximal length") are identified, and wherein the identifying also identifies events of all zeroes of the maximum length, and maximal length events that end in a non-zero-coefficient, such that escape codes may be avoided in coding the coefficients of the first region.

48. An apparatus as recited in claim 34,
wherein the means for identifying events includes the means for identifying the runlengths of one or more zero-valued coefficients and the means for identifying the runlengths of one or more non-zero-valued coefficients that follow the runlengths of zero-valued coefficients; and
wherein the means for encoding of the events, including the means for encoding the runlengths of identified runs of non-zero-valued coefficients, uses a first runlength coding method, and the means for encoding the runlengths of identified runs of zero-valued coefficients uses a second runlength coding method,
such that for at least some events, relatively more likely-to-occur pairs of runlengths are encoded by a shorter codeword than relatively less likely-to-occur runlengths.

49. An apparatus including a processing system that includes a at least one processor and a storage device, the storage device configured with instructions that when executed cause the apparatus to accept an ordered series of digital signals that each has a value including an amplitude from a finite set of amplitudes consisting of the most-likely-to-occur amplitude and at least one other amplitude, the apparatus to perform a method for processing an ordered series of digital signals to reduce the amount of data used to represent the digital signals and to form codewords such that the more likely-to-occur values or sequences of values of digital signals are represented by relatively short codewords and the less likely-to-occur values or sequences of values of digital signals are represented by relatively long codewords, the method comprising:
for a first contiguous region in the series:
identifying events that each includes a run of one or more consecutive signals having any value other than the most-likely-to-occur amplitude;
for each identified event, encoding the event with an event codeword that for at least some events, relatively more likely-to-occur events are encoded by a shorter event codeword than relatively less likely-to-occur events; and for each identified event, jointly encoding a plurality of consecutive values in the run of one or more consecutive signals having other than the most-likely-to-occur, amplitude, the jointly encoding being according to an amplitude coding method and generating an amplitude codeword, such that relatively short amplitude codewords are formed to represent values or sequences of values that are relatively more likely-to-occur, and relatively long amplitude codewords are formed to represent values or sequences of values that are relatively less likely-to-occur, such that codewords representing the first contiguous region can include both one or more event codewords and one or more amplitude codewords.

50. An apparatus as recited in claim 49, wherein the series of digital signals is a series of quantized coefficients of a transformed block of image data formed by a transform such that the most-likely-to-occur amplitude is 0, and the next most-likely-to-occur amplitude is 1, such that the identifying of events identifies events that each includes a run of one or more non-zero-valued coefficients.

51. An apparatus as recited in claim 50, wherein the transformed block of image data includes a DC term, and wherein the DC term is separately encoded, such that the series of digital signals is a set of non-DC quantized coefficients of a transformed block of image data.

52. An apparatus as recited in claim 50, wherein the jointly encoding a plurality of consecutive values includes jointly encoding a plurality of amplitudes, and separately encodes the signs of the amplitudes.

53. An apparatus as recited in claim 50, wherein the jointly encoding a plurality of consecutive values includes jointly encoding a plurality of amplitudes including the signs of the amplitudes, such that no separate sign encoding is used for the consecutive values that are jointly encoded.

54. An apparatus as recited in claim 50, wherein the jointly encoding a plurality of consecutive values includes using a multidimensional coding table.

55. An apparatus as recited in claim 50,
wherein the identifying events includes identifying events that each includes a run of consecutive zero-valued coefficients, preceding a run of one or more consecutive non-zero-valued coefficients, including events of no zero-valued coefficients preceding a run of one or more consecutive non-zero-valued coefficients; and
wherein the jointly encoding includes jointly encoding the run lengths of the preceding run of zero-valued coefficients and the following run of non-zero-valued coefficients, such that for at least some events, relatively more likely-to-occur pairs of runlengths are encoded by a shorter codeword than relatively less likely-to-occur runlengths.

56. An apparatus as recited in claim 55, wherein the method further comprises:
providing a breakpoint to define the first contiguous region along the ordering of the series followed by a second contiguous region; such that the coefficients of the first region are encoded by a first encoding method that includes the identifying of events, the jointly encoding the runlengths of the events, and the encoding the amplitudes of non-zero-valued coefficients of the events; and
encoding the coefficients in the second region using a second region encoding method, and
wherein the first region encoding method and the second region encoding method are such that the encoding of at least some of the coefficients or runs of coefficients in the first region is different than the encoding of at least some of the coefficients or runs of coefficients in the second region.

57. An apparatus as recited in claim 56, wherein the breakpoint value is pre-selected.

58. An apparatus as recited in claim 56, wherein the breakpoint value is selected from a finite set of pre-defined breakpoint values according to an image-dependent criterion.

59. An apparatus as recited in claim 56, wherein the second corresponding method is applicable to intraframe image data and to interframe blocks of image data, and wherein a first pre-selected breakpoint value is used for intraframe image data and a second pre-selected breakpoint value is used for interframe image data.

60. An apparatus as recited in claim 56, wherein the breakpoint defines a hard boundary between the first and second regions.

61. An apparatus as recited in claim 56, wherein the breakpoint defines a soft boundary between the first and second regions, such that for an identified event in the first region block having a sequence of consecutive non-zero values that crosses the breakpoint, the boundary between the first and second region is at the end of the event such that the whole event is in the first region.

62. An apparatus as recited in claim 55, wherein the joint encoding of the runlengths on an event uses a multidimensional coding table.

63. An apparatus as recited in claim 55, wherein the number of events that are identified and whose run lengths jointly encoded is limited such that only events up to a maximum total number of coefficients (the "maximal length") are identified, and wherein the identifying also identifies events of all zeroes of the maximum length, and maximal length events that end in a non-zero-coefficient, such that escape codes may be avoided in coding the coefficients of the first region.

64. An apparatus as recited in claim 50,
wherein the identifying events includes identifying the runlengths of one or more zero-valued coefficients and identifying the runlengths of one or more non-zero-valued coefficients that follow the runlengths of zero-valued coefficients; and
wherein the encoding of the events, including encoding the runlengths of identified runs of non-zero-valued coefficients, uses a first runlength coding method, and encoding the runlengths of identified runs of zero-valued coefficients uses a second runlength coding method, such that for at least some events, relatively more likely:to-occur pairs of runlengths are encoded by a shorter codeword than relatively less likely-to-occur runlengths.

* * * * *